(12) United States Patent
Cameron et al.

(10) Patent No.: US 6,743,563 B2
(45) Date of Patent: Jun. 1, 2004

(54) PHOTORESIST COMPOSITIONS

(75) Inventors: James F. Cameron, Cambridge, MA (US); Sheri L. Ablaza, Stow, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 6 days.

(21) Appl. No.: 09/930,880

(22) Filed: Aug. 15, 2001

(65) Prior Publication Data

US 2003/0044716 A1 Mar. 6, 2003

(51) Int. Cl.⁷ .............................................. G03F 7/004
(52) U.S. Cl. ..................... 430/270.1; 430/326; 430/905
(58) Field of Search .............................. 430/270.1, 326, 430/905

(56) References Cited

U.S. PATENT DOCUMENTS

| | | | | |
|---|---|---|---|---|
| 5,403,695 A | * | 4/1995 | Hayase et al. | 430/192 |
| 5,498,765 A | * | 3/1996 | Carpenter, Jr. et al. | 430/323 |
| 5,736,296 A | * | 4/1998 | Sato et al. | 430/270.1 |
| 5,879,856 A | * | 3/1999 | Thackeray et al. | 430/270.1 |
| 5,955,240 A | * | 9/1999 | Sato et al. | 430/270.1 |
| 6,387,587 B1 | * | 5/2002 | Oomori et al. | 430/270.1 |

OTHER PUBLICATIONS

Koes, U.S. patent application publication US 2003/0022098 A1 01–2003, 09/1995,880, Nov. 2000.*

* cited by examiner

Primary Examiner—Rosemary Ashton
(74) Attorney, Agent, or Firm—Peter F. Corless; Darryl P. Frickey; Edwards & Angell, LLP

(57) ABSTRACT

Resists of the invention contain an added acid component which has been found can significantly enhance stability during storage between manufacture and use. Preferred resists of the invention contain an ester-based solvent such as ethyl lactate or propylene glycol methyl ether acetate in addition to the acid component.

39 Claims, No Drawings

PHOTORESIST COMPOSITIONS

BACKGROUND OF THE INVENTION

1. Field of the Invention

This invention relates to photoresist compositions that can exhibit enhanced properties, including enhanced storage stability. In particular, resists of the invention contain an added acidic component which has been found can significantly enhance stability during storage between manufacture and use. Preferred resists of the invention contain an ester-based solvent such as ethyl lactate or propylene glycol methyl ether acetate in addition to the acid component

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Certain "chemically amplified" photoresist compositions have been employed for higher performance applications. Such photoresists may be negative-acting or positive-acting and rely on multiple crosslinking events (in the case of a negative-acting resist) or deprotection reactions (in the case of a positive-acting resist) per unit of photogenerated acid. In other words, the photogenerated acid acts catalytically. In the case of positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,851; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl, phenol or imide, which results in different solubility characteristics in exposed and unexposed areas of the resist coating layer.

An important property of a photoresist is photospeed, which can be defined as the exposure time coupled with the exposure energy required to activate the photoactive component, e.g. to generate a sufficient amount of photoacid to provide the desired solubility differential between exposed and unexposed areas of a photoresist coating layer.

A substantially consistent resist photospeed also can be critical, e.g. so that a device manufacturer can use the same imaging conditions and obtain consistent results despite lot-to-lot differences of a resist product (such as precise amount and/or nature of the photoacid generator, polymer, etc.) that may frequently occur, particularly in large scale resist manufacturing processes. However, many current resists do not exhibit such consistent photospeed, and consequently a device manufacturer may either realize inconsistent results as different lots of a resist formulation are used, or the device manufacture may be forced to carefully test the photospeed of each new lot of resist and then adjust the parameters of the exposure equipment to provide for consistent processing. Clearly, either alternative is undesirable.

Photospeed variations during storage also are indicative of resist degradation. For example, decreased photospeed of a resist upon storage can indicate degradation of the photoactive component or other resist components. Storage stability is typically of high importance for a photoresist Generally, after photoresist manufacture, a resist is stored for several months or more prior to use by a device manufacturer. Any resist degradation during storage typically will only compromise lithographic properties.

It thus would be desirable to have new photoresist compositions. It would be particularly desirable to have new photoresist compositions that can exhibit enhanced storage stability, e.g. as indicated by substantially consistent photospeed over time.

SUMMARY OF THE INVENTION

We have now discovered new photoresist compositions that can provide enhanced storage stability.

Resists of the invention contain an added acid component (stabilizer component), suitably an organic acid. We have surprisingly found that addition of an acid to a resist formulation can provide significantly enhanced stability (e.g. lack of visible particles and/or change in photospeed) over prolonged periods relative to comparable resists that do not contain the added acid. See, for instance, the comparative results set forth in the examples which follow.

Preferred added acids contain carboxylic acid moieties and are suitably relatively weak acids e.g. a pKa (in water at 25° C.) of zero or higher (more positive number), particularly a pKa of about 1, 2 or 3 or greater (i.e. even higher positive number). A pKa of from about 1 to 4 is particularly preferred. The acid also may have other substitution such as hydroxy, halo, cyano, alkoxy such as $C_{1-12}$alkoxy, and the like. The acid may suitably have from 1 to 20 carbon atoms, more typically 2 to about 12 carbons. Acids having from 2 to about 6 carbons are even more preferably. Specifically preferred added acids are lactic acid, acetic acid, propionic acid, and the like.

Preferred photoresists of the invention are positive chemically-amplified resists that contain a resin and a photoactive component. Particularly preferred resists also contain an added base such as an amine, particularly amine salts such as a salt of a tetraalkyl ammonium compound.

Especially preferred resists have a solvent component that comprises an ester-containing solvent such as ethyl lactate, propylene glycol methyl ether acetate (PGMEA), propylene glycol ethyl ether acetate, amyl acetate, or ethyl ether propionate (EEP). Ethyl lactate, amyl acetate and PGMEA are generally preferred. Preferred solvent components suitably contain a significant portion of an ester-based solvent, e.g. at least about 10, 15, 20, 25, 30 40 or 50 volume percent of the total solvent of the resist is one or more ester-based solvents, more preferably, at least about 60, 70, 80, 90 or 95 volume percent of the total solvents of a resist is one or more ester-based solvents such as ethyl lactate, amyl acetate or PGMEA.

Resists of the invention can be prepared by a variety of methods. In one preferred method, the resist formulation is preferred and the acid is added to the formed resist. Alternatively, the acid also may be formulated together with all other resist components, i.e. the resin, photoacid generator, basic component and acid may be added together to solvent carrier.

The invention also provide methods for forming relief images of the photoresists of the invention, including methods for forming highly resolved patterned photoresist images (e.g. a patterned line having essentially vertical sidewalls) of sub-quarter micron dimensions or less, such as sub-0.2 or sub-0.1 micron dimensions. The invention includes photoresists that can be imaged at a wide range of wavelengths, including sub-300 nm and sub-200 nm, such as 248 nm, 193 nm and 157 nm.

The invention further provides articles of manufacture comprising substrates such as a microelectronic wafer or a flat panel display substrate having coated thereon the photoresists and relief images of the invention.

Other aspects of the invention are disclosed infra.

DETAILED DESCRIPTION OF THE INVENTION

As discussed above, we now provide new photoresist compositions that can provide enhanced storage stability.

Resists of the invention contain an added acidic component, preferably an organic acid, more preferably an organic acid that has a pKa (as measured in water at 25° C.) of 0 or higher, particularly a pKa of from about 0.5 to 5.5, more preferably a pKa of from about 0.5 or 1 to about 3.5 or 4 or 4.5. Also preferred are organic carboxylic acids having a pKa of from about 1.5 or 2 to about 4 or 4.5.

Preferred acids used in a photoresist of the invention have a molecular weight of at least about 40 or 50, more preferably at least about 55, 6, 70, 80, 90 or 100. Polymeric acids may be used, but are less for preferred for at least some applications. Suitable oligomeric or polymeric added acid components may have molecular weights of at least 500 or greater, such as 1000, 1500, 2000, 2500, 3000, 3500, 4000, 4500, 5000 or greater.

The added acid component may be suitably employed within a wide concentration range in a photoresist composition. Greater storage stability can be exhibited with use of greater amounts of acid. Exemplary preferred amounts of the added acid component are set forth in the examples which follow.

Suitable amounts of the added acid component include at least 0.25 weight percent of the added acid component based on total solids (all components except solvent carrier) of a resist, more preferably at least about 0.5, 0.75, 0.8, 0.9, 1, 1.25, 1.5, 1.75, 2, 3, 4, or 5 weight percent of the added acid component based on total solids (all components except solvent carrier) of a resist. Generally preferred is use of the added acid component in an amount of 0.5 to about 1.5 or 2 weight percent more preferably from about 0.75 to about 1.5 or 2 weight percent based on total solids of the resist.

Also preferred is use of the added acid component in a weight excess relative to a basic additive (e.g. amine additive such as a tetraalkyl ammonium salt) of a resist, e.g. where the added acid component is present in about a 2, 3, 4, 5, 6, 7, 8, 9, 10, 15, 20 or 30-fold weight excess relative to a basic additive component.

Further preferred is where the added acid component is used in a weight amount that is less than the weight of the photoacid generator(s) used in the resist, e.g. the weight amount of the added component in no more than about 10, 20, 30, 40, 50, 60, 70, or 80 weight percent of the total weight of the photoacid generator(s) present in the resist.

Photoresists of the invention will preferably exhibit a substantially consistent photospeed over extended storage times, e.g. upon storage at room temperature (20° C. or 25° C. or below (e.g. refrigerated conditions such as 7° C. or 10° C.). As referred to herein, photospeed ($E_o$) designates the minimum exposure dose (mJ/cm$^2$) necessary to remove the imaged photoresist layer upon development. Preferred resists of the invention will exhibit no more than about a 10 percent change in photospeed over extended storage periods such as 10, 20, 30 or 36 weeks or more, particularly at room temperature or under refrigerated conditions; more preferably no more than about a 5 percent change in photospeed over such extended storage times, particularly at room temperature or under refrigerated conditions; still more preferably no more than about 4, 3, 2 or 1 percent change in photospeed over such extended storage periods, particularly at room temperature or under refrigerated conditions.

Exemplary suitable added acid components include organic carboxylic acids, particularly organic acids having 1 to 16 carbon atoms and from 0 to 3 carbon-carbon multiple bonds.

For instance, suitable added acid components include one or more of formic acid, optionally substituted acetic acid, optionally substituted propionic acid, optionally substituted butanionic acid, and optionally substituted lactic acid. Additional preferred added acid components (stabilizer components) include acetic acid substituted with groups such as cyano; fluoro including monofluoro, difluoro, and trifluoro; alkoxy including $C_{1-16}$ alkoxy such as methoxy; hydroxy; and the like. Additional suitable added acids include citric acid; crotonic acid; cyanomethyliminoacetic acid; gluconic acid; glyceric acid; glycolic acid; α-hydroxybutyric acid; β-hydroxybutyric acid maleic acid; malic acid; and the like.

Typically, the added acid component is not photoactivated in order to provide acidic group(s). That is, in distinction from a photoacid generator compound (including a photoacid generator compound that may generate a carboxylic acid group upon exposure to activating radiation),the stabilizer component comprises an acidic group such as a carboxylic acid moiety upon addition to a resist formulation, without any need for photoactivation to liberate the acidic moiety.

Especially preferred resist systems of the invention comprises an added acid component (stabilizer component) and an ionic basic component such as an amine salt particularly a tetraalkylammonium salt such as $(C_{1-12})_4N^+$ e.g. tetramethylammonium salt or tetrabutylammonium salt. Even more preferred is where the added acid component is the same or similar to the anion of the basic salt additive. For example, it is preferred to use lactic acid as the added acid component with a basic additive that is a tetraalcylammonium lactate. It is preferred to use acetic acid as the added acid component with a basic additive that is a tetraalkylammonium acetate. By stating that the added acid component is similar to the anion of the basic component it is meant that the acid component has a pKa of within about 0.5 or 1 of the pKa of the basic additive anion.

As discussed above, photoresists of the invention typically contain a resin component and a photoactive component. Photoresists of the invention preferably contain a resin that comprises one or more photoacid-acid labile moieties (e.g. ester or acetal groups) and one or more photoacid generator compounds (PAGs). The photoacid-labile moiety can undergo a deblocking reaction to provide a polar functional group such as hydroxyl or carboxylate. Preferably the resin component is used in a resist composition in an amount sufficient to render the resist developable with an aqueous alkaline solution.

Preferred PAGS can be photoactivated by exposure radiation having a wavelength of 248 nm, 193 nm or 157 nm.

Particularly preferred photoresists of the invention contain an imaging-effective amount of one or more photoacid generator compounds and a resin suitable for imaging at 300 nm or less or 200 nm or less, such as a resin selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference.

3) a resin that contains repeat units that contain a hetero atom, particularly oxygen and/or sulfur, and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

4) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

For imaging at wavelengths greater than 200 nm, such as 248 nm, a particularly preferred chemically amplified photoresist of the invention comprises in admixture a photoactive component of the invention and a resin that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

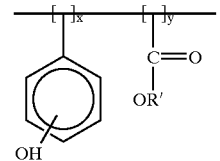

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halgen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted allkyl acrylate such as t-butylacrylate and the like may be condensed under free radical conditions as known in the art. The substituted ester moiety, ie. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

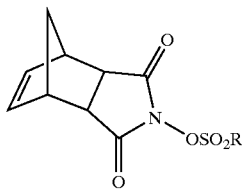

wherein R is camphor, adamantane, alkyl (e.g. $C_{1-12}$ alkyl) and perfluoroalkyl such as perfluoro($C_{1-12}$ alkyl), particularly perfluorooctanesulfonate, perfluorononanesulfonate and the like. A specifically preferred PAG is N-[(perfluorooctanesulfonyl)oxy]-5-norbornene-2,3-dicarboxinitide.

Sulfonate compounds are also suitable PAGs, particularly sulfonate salts. Two suitable agents for 193 nm and 248 nm imaging are the following PAGS 1 and 2:

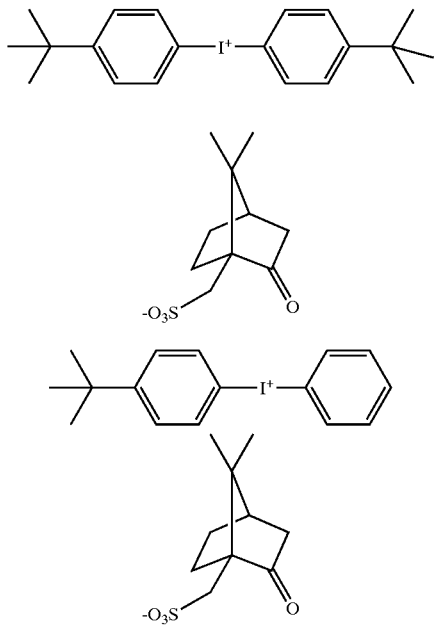

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3^-$ where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

Preferred negative acting compositions of the invention comprise a mixture of materials that will cure, crosslink or harden upon exposure to acid, and a photoactive component of the invention.

Particularly preferred negative acting compositions comprise a resin binder such as a phenolic resin, a crosslinker component and a photoactive component, particularly one or more photoacid generator compounds. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

As stated above, various materials including disclosed acid additive components may be optionally substituted. A "substituted" acid additive or other material may be suitably at one or more available positions, typically 1, 2 or 3 available positions, b groups such as hydroxy, halogen, $C_{1-6}$alkyl, $C_{1-6}$alkoxy, and the like.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

As discussed above, a preferred optional additive of resists of the invention is an added base, particularly tetrabutylammonium hydroxide (TBAH), or more particularly the lactate salt of tetrabutylammonium hydroxide, which can enhance resolution of a developed resist relief image. The added base is suitably used in relatively small amounts, e.g. about 1 to 10 percent by weight relative to the PAG, more typically 1 to about 5 weight percent Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, amninophenol, 2-(4-aminophenyl)-2-(4-hydroxyphenyl)propane, etc.

As discussed above, the resin component of resists of the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The photoresists of the invention are generally prepared following known procedures with the exception that an added acid is included in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate on which a resist of the invention is applied and processed suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz, glass or copper substrates may also be employed. Printed circuit board substrates such as copper clad laminates are also suitable.

Substrates used for liquid crystal display and other flat panel display applications are also suitably employed, e.g. glass substrates, indium tin oxide coated substrates and the like.

A liquid coating resist composition may be applied by any standard means such as spinning, dipping or roller coating. Photoresists of the invention also may be formulated and applied as dry film resists, particularly for printed circuit board manufacture applications. The exposure energy should be sufficient to effectively activate the photoactive component of the radiation sensitive system to produce a patterned image in the resist coating layer. Suitable exposure energies typically range from about 1 to 300 mJ/cm$^2$. As discussed above, preferred exposure wavelengths include sub-300 nm such as 248 nm, and sub-200 nm such as 193 nm and 157 nm. Suitable post-exposure bake temperatures are from about 50° C. or greater, more specifically from about 50 to 140° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting examples are illustrative of the invention.

General comments

In Examples 1–4 below, photospeed values were determined by calculating the minimum exposure dose (mJ/cm$^2$) required to provide a clear substrate surface upon development. In each of Examples 1–4 below, the photoresist (referred to as Resists 1–4 below).

In each of Examples 1–4 below, the resists (Resists 1–4) were processed as follows to determine photospeed values. The resists were spin coated to a layer thickness of 5000 Å±25Å over an organic crosslinked antireflective composition layer on a microelectronic wafer. The resist coating layers were softbaked at 135° C. for 60- seconds and exposed to patterned 248 nm radiation (0.63 NA, 0.75 sigma). The exposed coating layer was post-exposure baked at 130° C. for 90 seconds and developed with aqueous alkaline developer (45 seconds; single puddle).

EXAMPLES 1–3

Photoresist Preparation and Stability Evaluations

Example 1

A first photoresist (referred to herein as Resist 1) was prepared by admixng a resin that consisted of a terpolymer of vinyl phenol, styrene and t-butylmethacrylate, a photoacid generator of di-t-butylphenyliodonium 2-trifluormethylbenzenesulfonate, a basic component of tetramethyl ammonium lactate, and lactic acid formulated as 14 percent solids (all components except solvent) in a solvent of ethyl lactate. The lactic acid was present in an amount of 0.96 weight percent based on total solids (all components except ethyl lactate solvent).

After preparation, Resist 1 samples were stored in brown glass bottles at temperatures of 20° C. and 40° C. Photospeed measurements were made immediately after preparation and after storing the prepared resist for 2 weeks, 4 weeks, 6 weeks, 8 weeks, 12 weeks and 20 weeks after preparation.

The following photospeed values were thus obtained for the sample of Resist 1 stored at 20° C.:

immediately after preparation: 10.2 mJ/cm$^2$
2 weeks: 9.8 mJ/cm$^2$
4 weeks: 10.7 mJ/cm$^2$
6 weeks: 10.2 mJ/cm$^2$
8 weeks: 10.6 mJ/cm$^2$
12 weeks: 10.3 mJ/cm$^2$
20 weeks: 10.3 mJ/cm$^2$ The following photospeed values were thus obtained for the sample of Resist 1 stored at 40° C.:

immediately after preparation: 10.2 mJ/cm$^2$
2 weeks: 9.2 mJ/cm$^2$
4 weeks: 9.6 mJ/cm$^2$
6 weeks: 8.7 mJ/cm$^2$
8 weeks: 8.6 mJ/cm$^2$
12 weeks: 7.9 mJ/cm$^2$
20 weeks: 7.4 mJ/cm$^2$ Example 2

A second photoresist (refereed to herein as Resist 2) was prepared in the same manner and using the same components as Resist 1 of Example 1 above, except the lactic acid was present in an amount of about 0.36 weight percent based on total solids (all components except ethyl lactate solvent).

After preparation, Resist 2 samples were stored in brown glass bottles at temperatures of 20° C. and 40° C. Photospeed measurements were made immediately after preparation and after storing the prepared resist for 2 weeks, 4 weeks, 6 weeks, 8 weeks, 12 weeks and 20 weeks after preparation.

The following photospeed values were thus obtained for the sample of Resist 2 stored at 20° C.:

immediately after preparation: 10.0 mJ/cm²
2 weeks: 94 mJ/cm²
4 weeks: 10.2 mJ/cm²
6 weeks: 9.8 mJ/cm²
8 weeks: 10.1 mJ/m²
12 weeks: 9.8 mJ/cm²
20 weeks: 9.9 mJ/cm²

The followings photospeed values were thus obtained for the sample of Resist 2 stored at 40° C.:

immediately after preparation: 10.0 mJ/cm⁻
2 weeks: 8.1 mJ/cm²
4 weeks: 8.0 mJ/cm²
6 weeks: 7.0 mJ/cm²
8 weeks: 6.8 mJ/cm²
12 weeks: 6.2 mJ/cm²
20 weeks: 5.8 mJ/cm²

Example 3

A third photoresist (referred to herein as Resist 3) was prepared in the same manner and using the same components as Resist 1 of Example 1 above, except the lactic acid was present in an amount of 0.05 weight percent based on total solids (all components except ethyl lactate solvent).

After preparation, Resist 3 samples were stored in brown glass bottles at temperatures of 20° C. and 40° C. Photospeed measurements were made immediately after preparation and after storing the prepared resist for 2 weeks, 4 weeks, 6 weeks, 8 weeks, 12 weeks and 20 weeks after preparation.

The following photospeed values were thus obtained for the sample of Resist 3 stored at 20° C.:

immediately after preparation: 9.5 mJ/cm²
2 weeks: 92 mJ/cm²
4 weeks: 10.0 mJ/cm²
6 weeks: 9.6 mJ/cm²
8 weeks: 9.7 mJ/cm²
12 weeks: 9.4 mJ/cm²
20 weeks: 9.3 mJ/cm²

The following photospeed values were thus obtained for the sample of Resist 3 stored at 40° C.:

immediately after preparation: 9.5 mJ/cm²
2 weeks: 6.8 mJ/cm²
4 weeks: 6.5 mJ/cm²
6 weeks: 5.7 mJ/cm²
8 weeks: 5.7 mJ/cm²
12 weeks: 4.8 mJ/cm²
20 weeks: 4.6 mJ/cm²

Example 4 (comparative)

A fourth photoresist (referred to herein as Resist 4) was prepared in the same manner and using the same components as Resist 1 of Example 1 above, except Resist 4 contained no lactic acid or other added acid.

After preparation, Resist 4 samples were stored in brown glass bottles at temperatures of 20° C. and 40° C. Photospeed measurements were made immediately after preparation and after storing the prepared resist for 2 weeks, 4 weeks, 6 weeks, 8 weeks, 12 weeks and 20 weeks after preparation.

The following photospeed values were thus obtained for the sample of Resist 4 stored at 20° C.:

immediately after preparation: 9.6 mJ/cm²
2 weeks: 9.2 mJ/cm²
4 weeks: 9.8 mJ/cm²
6 weeks: 9.3 mJ/cm²
8 weeks: 9.6 mJ/cm²
12 weeks: 9.2 mJ/cm²
20 weeks: 9.2 mJ/cm²

The following photospeed values were thus obtained for the sample of Resist 4 stored at 40° C.:

immediately after preparation: 9.5mJ/cm²
2 weeks: 6.4 mJ/cm²
4 weeks: 6.1 mJ/cm²
6 weeks: 5.3 mJ/cm²
8 weeks: 5.1 mJ/cm²
12 weeks: 4.3 mJ/cm²
20 weeks: 4.2 mJ/cm²

The foregoing description of the invention is merely illustrative thereof, and it is understood that variations and modifications can be effected without departing from the spirit or scope of the invention as set forth in the following claims.

What is claimed is:

1. A chemically-amplified positive photoresist composition comprising 1) a resin that comprises phenolic and alkyl acrylate groups, 2) a photoacid generator compound, and 3) lactic acid or acetic acid.

2. The photoresist of claim 1 wherein the lactic acid or acetic acid is present in an amount of at least about 1 weight percent based on total solids of the photoresist composition.

3. The photoresist of claim 1 further comprising a basic component.

4. The photoresist of claim 3 wherein the basic component is an amine.

5. The photoresist of claim 1 wherein the photoresist comprises a solvent that contains an ester moiety.

6. The photoresist of claim 5 wherein the photoresist comprises a solvent component that comprises ethyl lactate.

7. The photoresist of claim 6 wherein the acid is lactic acid.

8. The photoresist of claim 1 wherein the photoresist comprises a solvent component that comprises propylene glycol methyl ether acetate.

9. The photoresist of claim 8 wherein the acid is acetic acid.

10. A chemically-amplified positive photoresist composition comprising:
1) i) a resin that comprises polymerized units of cyclic olefin groups and/or anhydride groups, or ii) a fluoro-substituted resin,
2) a photoacid generator compound, and
3) lactic acid or acetic acid.

11. The photoresist of claim 10 wherein the lactic acid or acetic acid is present in an amount of at least about 1 weight percent based on total solids of the photoresist composition.

12. The photoresist of claim 10 further comprising a basic component.

13. The photoresist of claim 12 wherein the basic component is an amine.

14. The photoresist of claim 10 wherein the photoresist comprises a resin that comprises polymerized units of cyclic olefin groups and/or anhydride groups.

15. The photoresist of claim 10 wherein the photoresist comprises a fluoro-substituted resin.

16. The photoresist of claim 10 wherein the photoresist comprises a solvent that contains an ester moiety.

17. The photoresist of claim 16 wherein the photoresist comprises a solvent component that comprises ethyl lactate.

18. The photoresist of claim 17 wherein the acid is lactic acid.

19. The photoresist of claim 10 wherein the photoresist comprises a solvent component that comprises propylene glycol methyl ether acetate.

20. The photoresist of claim 19 wherein the acid is acetic acid.

21. A chemically-amplified positive photoresist composition comprising 1) a resin that is at least essentially free of aromatic groups, 2) a photoacid generator compound, and 3) lactic acid or acetic acid.

22. The photoresist of claim 21 wherein the lactic acid or acetic acid is present in an amount of at least about 1 weight percent based on total solids of the photoresist composition.

23. The photoresist of claim 21 further comprising a basic component.

24. The photoresist of claim 23 wherein the basic component is amine.

25. The photoresist of claim 21 wherein the photoresist comprises a solvent that contains an ester moiety.

26. The photoresist of claim 25 wherein the photoresist comprises a solvent component that comprises ethyl lactate.

27. The photoresist of claim 26 wherein the acid is lactic acid.

28. The photoresist of claim 21 wherein the photoresist comprises a solvent component that comprises propylene glycol methyl ether acetate.

29. The photoresist of claim 28 wherein the acid is acetic acid.

30. The photoresist of claim 21 wherein the resin comprises polymerized units of cyclic olefin groups and/or anhydride groups.

31. The photoresist of claim 21 wherein the resin comprises a fluoro-substituted resin.

32. A chemically-amplified positive photoresist composition comprising 1) a resin that comprises phenolic and alkyl acrylate groups, 2) a photoacid generator compound, 3) lactic acid or acetic acid, and 4) a basic component.

33. The photoresist of claim 32 wherein the lactic acid is present in an amount of at least about 0.5 weight percent based on total solids of the photoresist composition.

34. The photoresist of claim 32 wherein the lactic acid is present in an amount of at least about 1 weight percent based on total solids of the photoresist composition.

35. The photoresist of claim 32 wherein the basic component is an amine.

36. A method of producing an article of manufacture comprising:

(a) applying a coating layer of a photoresist of claim 1 on a wafer substrate; and (b) exposing the photoresist coating layer to patterned activating radiation and developing the exposed photoresist layer to provide a photoresist relief image.

37. A method of producing an article of manufacture comprising:

(a) applying a coating layer of a photoresist of claim 10 on a wafer substrate; and (b) exposing the photoresist coating layer to patterned activating radiation and developing the exposed photoresist layer to provide a photoresist relief image.

38. A method of producing an article of manufacture comprising:

(a) applying a coating layer of a photoresist of claim 21 on a wafer substrate; and (b) exposing the photoresist coating layer to patterned activating radiation and developing the exposed photoresist layer to provide a photoresist relief image.

39. A method of producing an article of manufacture comprising:

(a) applying a coating layer of a photoresist of claim 32 on a wafer substrate; and (b) exposing the photoresist coating layer to patterned activating radiation and developing the exposed photoresist layer to provide a photoresist relief image.

* * * * *